(12) United States Patent
Chang et al.

(10) Patent No.: US 9,564,502 B2
(45) Date of Patent: Feb. 7, 2017

(54) TECHNIQUES FOR MULTIPLE GATE WORKFUNCTIONS FOR A NANOWIRE CMOS TECHNOLOGY

(71) Applicant: International Business Machines Corporation, Armonk, NY (US)

(72) Inventors: Josephine B. Chang, Ellicott City, MD (US); Michael A. Guillorn, Yorktown Heights, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/243,065

(22) Filed: Aug. 22, 2016

(65) Prior Publication Data

US 2016/0359011 A1 Dec. 8, 2016

Related U.S. Application Data

(62) Division of application No. 14/671,173, filed on Mar. 27, 2015, now Pat. No. 9,443,949.

(51) Int. Cl.
*H01L 29/06* (2006.01)
*H01L 29/423* (2006.01)
(Continued)

(52) U.S. Cl.
CPC ......... *H01L 29/42392* (2013.01); *H01L 21/84* (2013.01); *H01L 27/092* (2013.01);
(Continued)

(58) Field of Classification Search
CPC ............. H01L 29/0669; H01L 29/0673; H01L 29/413; H01L 29/41725; H01L 29/42392; H01L 27/092; H01L 27/1203; H01L 2924/13086

See application file for complete search history.

(56) References Cited

U.S. PATENT DOCUMENTS

| 7,262,104 B1 | 8/2007 | Wang et al. |
| 7,884,004 B2 | 2/2011 | Bangsaruntip et al. |
| (Continued) | | |

OTHER PUBLICATIONS

Hussain et al., "Gate-First Integration of Tunable Work Function Metal Gates of Different Thicknesses Into High-k/Metal Gates CMOS FinFETs for Multi-VTh Engineering," IEEE Transactions on Electron Devices, vol. 57, No. 3, pp. 626-631 (Mar. 2010).

(Continued)

*Primary Examiner* — Hoai V Pham
(74) *Attorney, Agent, or Firm* — Louis J. Percello; Michael J. Chang, LLC

(57) ABSTRACT

In one aspect, a method of forming a CMOS device with multiple transistors having different Vt's is provided which includes: forming nanowires and pads on a wafer, wherein the nanowires are suspended at varying heights above an oxide layer of the wafer; and forming gate stacks of the transistors at least partially surrounding portions of each of the nanowires by: i) depositing a conformal gate dielectric around the nanowires and on the wafer beneath the nanowires; ii) depositing a conformal workfunction metal on the conformal gate dielectric around the nanowires and on the wafer beneath the nanowires, wherein an amount of the conformal workfunction metal deposited around the nanowires is varied based on the varying heights at which the nanowires are suspended over the oxide layer; and iii) depositing a conformal poly-silicon layer on the conformal workfunction metal around the nanowires and on the wafer beneath the nanowires.

6 Claims, 13 Drawing Sheets

(51) Int. Cl.
  *H01L 27/12* (2006.01)
  *H01L 27/092* (2006.01)
  *H01L 21/84* (2006.01)
  *H01L 29/49* (2006.01)

(52) U.S. Cl.
  CPC ...... *H01L 27/1203* (2013.01); *H01L 29/0673* (2013.01); *H01L 29/495* (2013.01)

(56) References Cited

U.S. PATENT DOCUMENTS

| | | | |
|---|---|---|---|
| 7,943,458 B2 | 5/2011 | Jagannathan et al. | |
| 8,384,065 B2 | 2/2013 | Bangsaruntip et al. | |
| 8,673,731 B2 | 3/2014 | Chang et al. | |
| 8,927,397 B2 | 1/2015 | Chang et al. | |
| 9,331,146 B2 | 5/2016 | Chen et al. | |
| 2010/0295022 A1 | 11/2010 | Chang et al. | |
| 2011/0278543 A1 | 11/2011 | Bangsaruntip et al. | |
| 2012/0043620 A1 | 2/2012 | Guo et al. | |
| 2013/0154002 A1 | 6/2013 | Kuo et al. | |
| 2013/0270641 A1 | 10/2013 | Chi | |
| 2013/0313643 A1 | 11/2013 | Doris et al. | |
| 2013/0316503 A1 | 11/2013 | Doris et al. | |
| 2014/0048773 A1 | 2/2014 | Chang et al. | |
| 2014/0051213 A1 | 2/2014 | Chang et al. | |
| 2016/0218179 A1* | 7/2016 | Feng | H01L 21/02603 |

OTHER PUBLICATIONS

Rao et al., "High-K Metal-Gate PMOS FinFET Threshold Voltage Tuning with Aluminum Implantation," Proc. AIP conference on Ion Implantation Technology 2012, 1496, pp. 38-41 (Jun. 2012).

Gokirmak et al., "Accumulated body ultranarrow channel silicon transistor with extreme threshold voltage tunability", Applied Physics Letters 91, 243504 (Dec. 2007).

List of IBM Patents or Applications Treated as Related.

* cited by examiner

TECHNIQUES FOR MULTIPLE GATE WORKFUNCTIONS FOR A NANOWIRE CMOS TECHNOLOGY

CROSS-REFERENCE TO RELATED APPLICATIONS

This application is a divisional of U.S. application Ser. No. 14/671,173 filed on Mar. 27, 2015, the contents of which are incorporated by reference herein.

FIELD OF THE INVENTION

The present invention relates to nanowire complementary metal oxide semiconductor (CMOS) devices and more particularly, to techniques for controlling threshold voltage (Vt) in nanowire CMOS devices based on varying a suspension height of the nanowires over a buried oxide (BOX) and thereby varying an amount of gate workfunction metal present under the nanowires.

BACKGROUND OF THE INVENTION

It is desirable to be able to control threshold voltage (Vt) in metal oxide semiconductor field effect transistor (MOSFET) devices. For instance, some MOSFET designs include multiple Vt's wherein the Vt varies from one device to another. In bulk MOSFET designs wherein the channel is formed in a bulk semiconductor, the Vt is often adjusted through doping. However, setting multiple Vt's in a fully depleted device is challenging since doping is no longer an option to adjust Vt.

Varying amounts of a workfunction setting metal in the gate stack has been used to change the Vt in planar complementary metal-oxide semiconductor (CMOS) devices. See, for example, U.S. Pat. No. 8,673,731 issued to Chang et al., entitled "Techniques for Gate Workfunction Engineering to Reduce Short Channel Effects in Planar CMOS Devices" (hereinafter "U.S. Pat. No. 8,673,731"). As described in U.S. Pat. No. 8,673,731, the more metal in the gate, the lower the Vt.

There however exists a need for efficient and effective techniques for controlling Vt in non-planar device configurations.

SUMMARY OF THE INVENTION

The present invention provides techniques for controlling threshold voltage (Vt) in nanowire complementary metal oxide semiconductor (CMOS) devices based on varying a suspension height of the nanowires over a buried oxide (BOX) and thereby varying an amount of gate workfunction metal present under the nanowires. In one aspect of the invention, a method of forming a CMOS device with multiple nanowire-based transistors having different threshold voltages is provided. The method includes the steps of: providing a wafer having an oxide layer on a substrate; forming nanowires and pads on the wafer, wherein the pads are attached to opposite ends of the nanowires and anchor the nanowires to the wafer, and wherein the nanowires are suspended at varying heights above the oxide layer; and forming gate stacks of the nanowire-based transistors at least partially surrounding portions of each of the nanowires by: i) depositing a conformal gate dielectric both around the nanowires and on the wafer beneath the nanowires; ii) depositing a conformal workfunction metal on the conformal gate dielectric both around the nanowires and on the wafer beneath the nanowires, wherein an amount of the conformal workfunction metal deposited around the nanowires is varied based on the varying heights at which the nanowires are suspended over the oxide layer; and iii) depositing a conformal poly-silicon layer on the conformal workfunction metal both around the nanowires and on the wafer beneath the nanowires, wherein the portions of the nanowires at least partially surrounded by the gate stacks serve as channel regions of the nanowire-based transistors, wherein portions of the nanowires extending out from the gate stacks and the pads serve as source and drain regions of the nanowire-based transistors, and wherein the nanowire-based transistors have different threshold voltages based on the varied amount of the conformal workfunction metal deposited around the nanowires.

In another aspect of the invention, a CMOS device with multiple nanowire-based transistors having different threshold voltages is provided. The CMOS device includes: a wafer having an oxide layer on a substrate; nanowires and pads on the wafer, wherein the pads are attached to opposite ends of the nanowires and anchor the nanowires to the wafer, and wherein the nanowires are suspended at varying heights above the oxide layer; and gate stacks of the nanowire-based transistors at least partially surrounding portions of each of the nanowires, the gate stacks comprising i) a conformal gate dielectric both around the nanowires and on the wafer beneath the nanowires; ii) a conformal workfunction metal on the conformal gate dielectric both around the nanowires and on the wafer beneath the nanowires, wherein an amount of the conformal workfunction metal deposited around the nanowires is based on the varying heights at which the nanowires are suspended over the oxide layer; and iii) a conformal poly-silicon layer on the conformal workfunction metal both around the nanowires and on the wafer beneath the nanowires, wherein the portions of the nanowires at least partially surrounded by the gate stacks serve as channel regions of the nanowire-based transistors, wherein portions of the nanowires extending out from the gate stacks and the pads serve as source and drain regions of the nanowire-based transistors, and wherein the nanowire-based transistors have different threshold voltages based on the varied amount of the conformal workfunction metal deposited around the nanowires.

A more complete understanding of the present invention, as well as further features and advantages of the present invention, will be obtained by reference to the following detailed description and drawings.

DETAILED DESCRIPTION OF PREFERRED EMBODIMENTS

Figure 1:
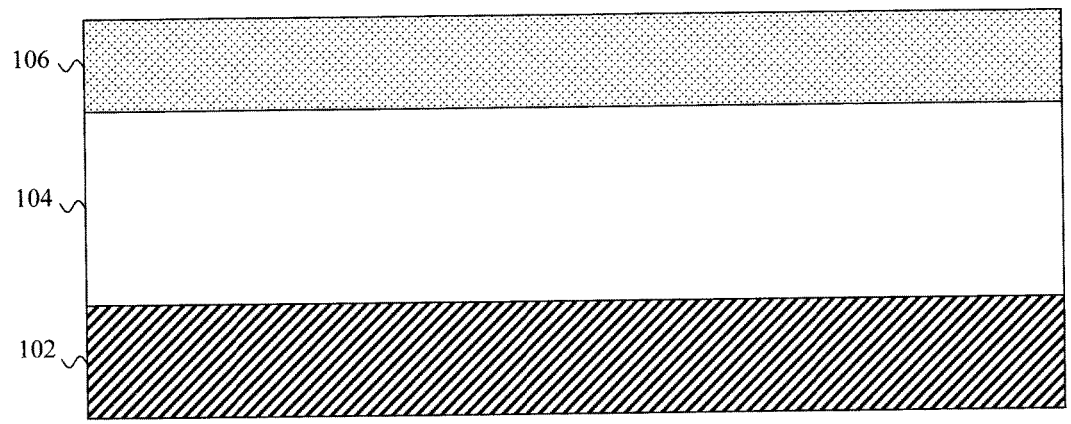
FIG. 1 is a cross-sectional diagram illustrating a starting structure for forming a nanowire complementary metal oxide semiconductor (CMOS) device including a semiconductor-on-insulator (SOI) wafer having a SOI layer separated from a substrate by an oxide layer according to an embodiment of the present invention.

Provided herein are techniques for controlling the threshold voltage (Vt) of nanowire complementary metal oxide semiconductor (CMOS) devices using a gate first process wherein a suspension height of the nanowires over an underlying oxide (e.g., buried oxide (BOX) or high density plasma (HDP) oxide) is modulated to control how much of a workfunction setting gate metal is deposited under the nanowires. On the one hand, the nanowires can be suspended high enough above the underlying oxide that the workfunction setting gate metal can fully surround the nanowires. Alternatively, the nanowires can be suspended low enough such that no workfunction setting gate metal can be placed under the nanowires. As provided above, the greater the amount of workfunction setting gate metal present, the lower the Vt. Variations of these two cases can be used to further modulate the amount of gate metal and thus the Vt. For instance, as will be described in detail below, by lowering the suspension height the workfunction setting gate metal deposited around the nanowires can merge with the workfunction setting gate metal deposited on the wafer thereby increasing the amount of the workfunction setting gate metal and thus further decreasing the Vt.

Additionally, in the instance where the suspended nanowires are low enough such that the workfunction setting gate metal is not present beneath the nanowires, and if a high-κ gate dielectric of the gate stack is in contact with the underlying oxide (e.g., BOX or HDP oxide), then the underlying oxide can serve as a source of oxygen which diffuses through the high-κ gate dielectric and oxidizes the nanowires. Oxidation at the interface between the nanowires and the gate dielectric reduces the Vt. See, for example, U.S. patent application Ser. No. 14/671,041, filed on Mar. 27, 2015, entitled "Techniques for Dual Dielectric Thickness for a Nanowire CMOS Technology Using Oxygen Growth", the contents of which are incorporated by reference as if fully set forth herein. The term "high-κ," as used herein, refers to a material having a dielectric constant κ which is higher than that of silicon (i.e., 11.7). Only minimal oxide growth occurs at this interface between the nanowires and the gate dielectric (based on an oxygen ambient) where the high-κ and the underlying oxide are not in contact. Thus, the amount of oxide growth can too be regulated to control the Vt.

The present techniques generally involve controlling the suspension height of the nanowires to regulate the space between the suspended nanowires and the underlying oxide (e.g., BOX or HDP oxide). By way of example only, two illustrative techniques are presented herein for varying the suspension height of the nanowires (i.e., the height at which the nanowires are suspended over the underlying oxide). In a first exemplary embodiment, the nanowires are formed on a stepped surface of a sacrificial layer. Removal of the sacrificial layer from beneath the nanowires results in the nanowires being suspended at differing heights. In a second exemplary embodiment, the underlying oxide is undercut beneath the nanowires to release/suspend the nanowires. The depth of the undercut is varied to suspend the nanowires at different heights.

The first embodiment for using a stepped surface to suspend the nanowires at different heights is now described by way of reference to FIGS. 1-13 which illustrate an exemplary methodology for forming a nanowire CMOS device. As shown in FIG. 1, the process begins with a semiconductor-on-insulator (SOI) wafer. The SOI wafer includes a SOI layer 106 separated from a substrate 102 by an oxide layer 104 (e.g., silicon dioxide ($SiO_2$)). The oxide layer 104 can be a buried oxide or HDP oxide layer. As is known in the art, a BOX can be created in a wafer using an implantation process such as separation by implantation of oxygen (SIMOX) or by way of a wafer bonding technique. In this example, a stepped surface will be created on a side of the SOI layer 106 opposite oxide layer 104. Nanowires will be formed on that stepped surface, after which the SOI layer 106 will be removed to release and suspend the nanowires. The SOI layer 106 is therefore a sacrificial layer.

To ensure selective removal of the SOI layer 106 relative to the nanowires, the SOI layer 106 is preferably formed from a material that can be etched selective to the nanowire material. By way of example only, when silicon (Si) nanowires are present, a suitable sacrificial material for forming the SOI layer 106 includes, but is not limited to, silicon germanium (SiGe). In that case, the starting wafer is a SiGe-on-insulator wafer.

Figure 2:
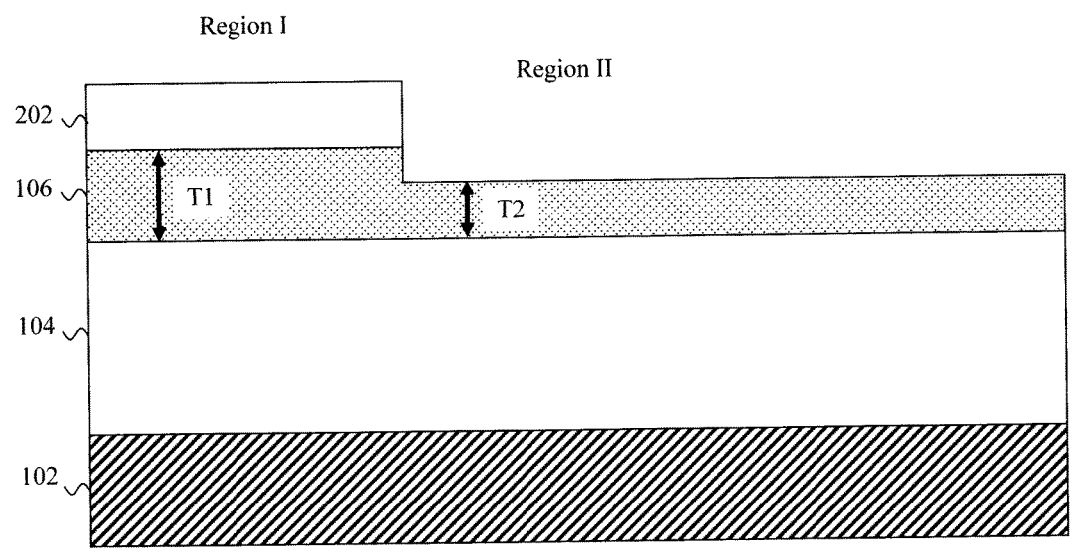
FIG. 2 is a cross-sectional diagram illustrating a stepped surface of the SOI layer having been formed in a first Region I and a second Region II of the wafer according to an embodiment of the present invention.
Figure 3:
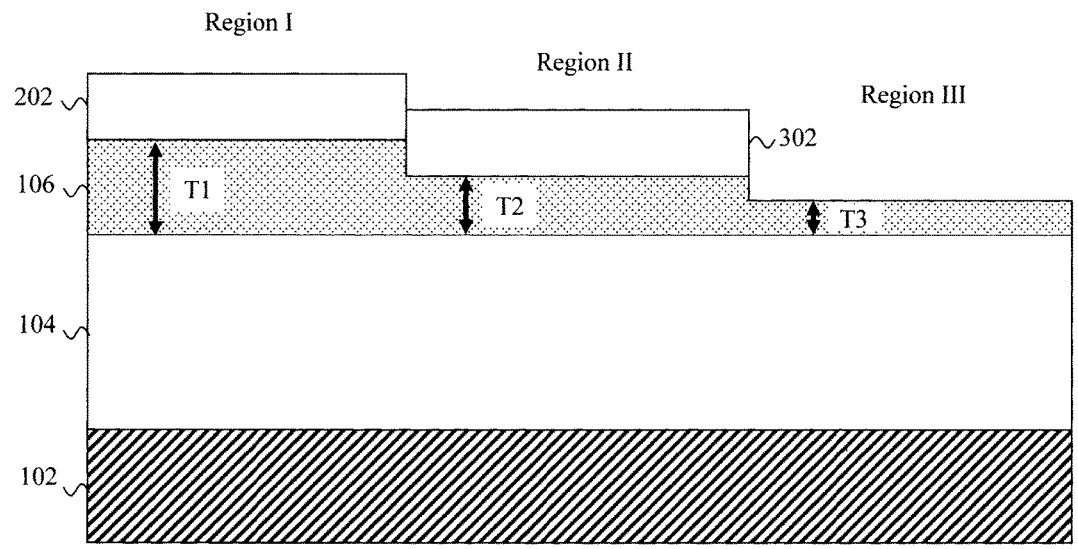
FIG. 3 is a cross-sectional diagram illustrating a stepped surface of the SOI layer having been formed in a third Region III of the wafer according to an embodiment of the present invention.
Figure 4:
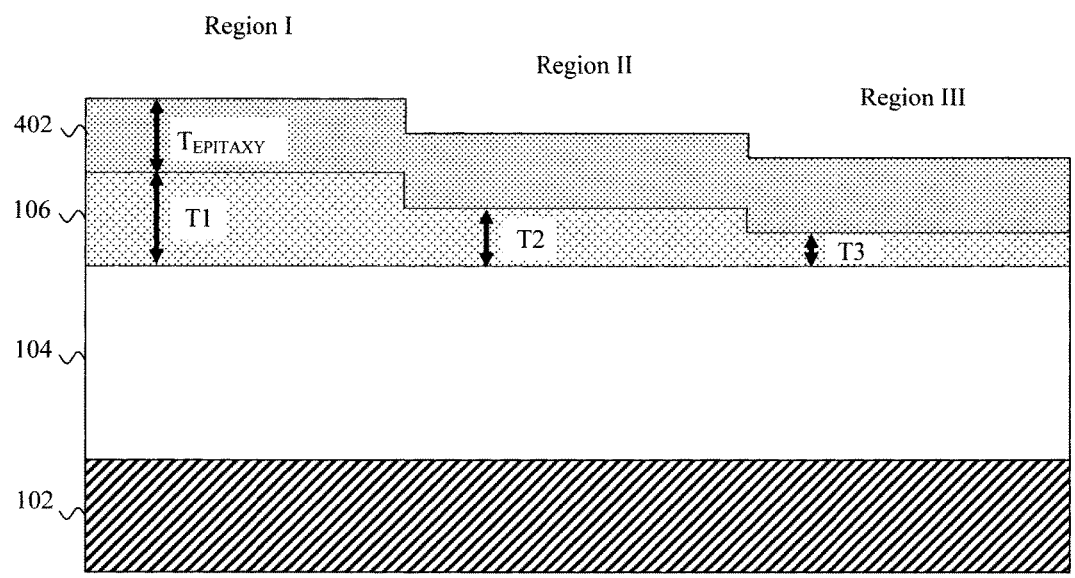
FIG. 4 is a cross-sectional diagram illustrating a layer of an epitaxial semiconductor material having been grown on the stepped surface of the SOI layer according to an embodiment of the present invention.

To create a stepped surface on the SOI layer 106 a series of masking and etching steps are performed. This process is depicted in FIG. 2 and FIG. 3. In general, the process involves masking one or more regions of the wafer, and performing an etch to reduce the thickness of the SOI layer 106 in one or more other regions of the wafer. The result is the SOI layer 106 having at least two different thicknesses. The process can be repeated to further reduce the thickness of the SOI layer 106 in one or more additional regions of the wafer. These regions of differing thickness give the surface of the SOI layer 106 a stepped design.

Since the nanowires will be formed on the SOI layer 106, the thicknesses of the SOI layer 106 will determine the suspension height of the nanowires once the SOI layer 106 is removed. Thus, according to an exemplary embodiment, the starting thickness of the SOI layer 106 is equivalent to the maximum nanowire suspension height. Reducing the thickness of the SOI layer 106 in other regions of the wafer will serve to reduce the suspension height of the nanowires in those other regions below that maximum height.

In the figures and following description reference is made to different regions of the wafer labeled for convenience as Region I, Region II, etc. In the following example, the nanowire suspension height will be reduced from Region I to Region II, and again from Region II to Region III, with Region I containing the nanowires suspended at the greatest height over the oxide layer 104 and Region III having the nanowires suspended at the lowest height over the oxide layer 104. This is done merely for ease and clarity of description, and the present techniques should not be construed as being limited to any particular configuration.

The masking and etching processes for creating the stepped surface on SOI layer 106 are now described in detail. As shown in FIG. 2, a mask 202 is formed over a first region(s) of the wafer (in this example Region I). The mask may be formed using standard lithography and etching techniques. The mask 202 will prevent reduction of the thickness of SOI layer 106 in Region I of the wafer. Namely, an etching process such as reactive etching (RIE) is next used to reduce the thickness of SOI 106 in the unmasked regions of the wafer (such as Region II in the present example). The etch can be end-pointed when a desired reduced thickness is achieved in Region II of the wafer.

The SOI layer 106 now has a stepped surface with two different thicknesses T1 and T2 in Region I and Region II, respectively, wherein T1>T2. To further illustrate the present process, the SOI layer 106 is optionally reduced to a third thickness in the Region III of the wafer. See FIG. 3. The same general process is employed to further step the surface in this third region of the wafer. Namely, a mask 302 is formed over the Region II of the wafer. It is assumed that the mask 202 remains in place covering Region I. A timed etch is then used to reduce the thickness of the SOI layer 106 in Region III of the wafer to a thickness T3, wherein T1>T2>T3. Following the final stepping etch, the masks 202, 302, etc. can be removed.

To form the nanowires, an epitaxial semiconductor material 402 is deposited onto the stepped surface of the SOI layer 106 (i.e., on a side of the SOI layer opposite the oxide layer 104). The epitaxial semiconductor material will, when released from the SOI layer 106 form the suspended nanowires of the device. As highlighted above, the SOI layer 106 will be removed from beneath the nanowires using a selective etching process. Thus, the epitaxial semiconductor material 402 employed for forming the nanowires is preferably a material that enables etch selectivity vis-à-vis the SOI layer. By way of example only, when the SOI layer is formed from SiGe (see above), then epitaxial Si would be a suitable choice for the epitaxial semiconductor material 402 since SiGe can be effectively etched selective to Si using a number of different wet or dry etching processes (see below).

The epitaxial semiconductor material 402 is preferably formed to a uniform thickness $T_{EPITAXY}$ on the stepped surface of the SOI layer 106. This will insure that the nanowires formed therefrom have a uniform dimension. However, as shown in FIG. 3, since the epitaxial semiconductor material 402 is formed on a stepped surface the epitaxial semiconductor material 402 will be present at differing heights over the oxide layer 104 in the different regions of the wafer. According to an exemplary embodiment, the epitaxial semiconductor material 402 is grown to a uniform thickness $T_{EPITAXY}$ of from about 5 nanometers (nm) to about 20 nm, and ranges therebetween, on the SOI layer 106.

Fins are then patterned in the epitaxial semiconductor material 402/SOI layer 106. See FIG. 5. To pattern the fins, a hardmask 502 is first formed on a side of the epitaxial semiconductor material 402 opposite the SOI layer 106. The hardmask marks the footprint and location of the nanowires (and preferably of anchor pads). Namely, in order to enable fully suspended nanowires, anchor pads or simply pads are often employed at opposite ends of the nanowires to anchor the nanowires to the wafer. Each nanowire can have its own set of anchor pads or multiple nanowires can be anchored using a common set of pads (e.g., wherein the pads are attached at opposite ends of the nanowires forming a ladder-like configuration with the nanowires arranged like the rungs of a ladder—see for example U.S. Pat. No. 8,927,397 issued to Chang et al., entitled "Diode Structure and Method for Gate All Around Silicon Nanowire Technologies," the contents of which are incorporated by reference as if fully set forth herein). Either configuration is contemplated herein.

Figure 5:
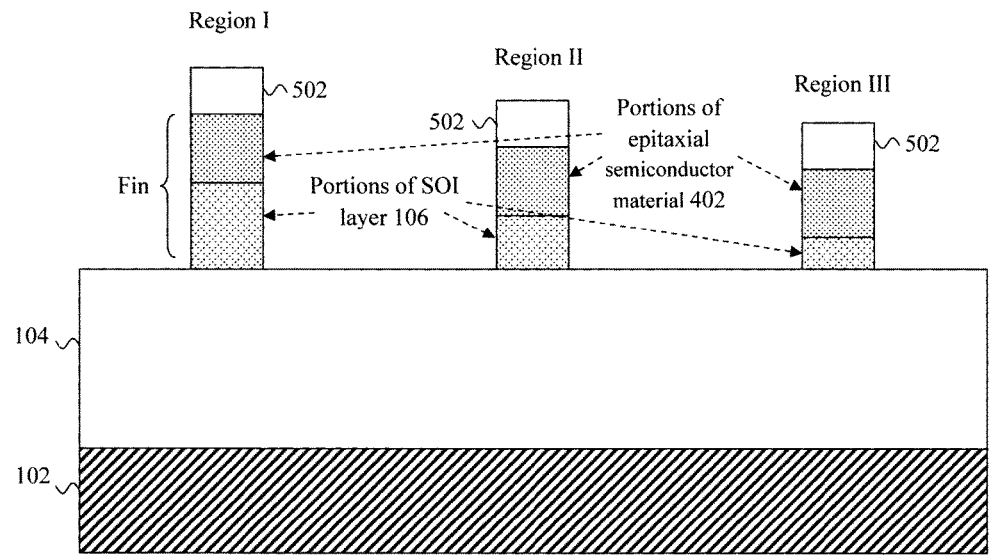
FIG. 5 is a cross-sectional diagram illustrating fins having been patterned in the epitaxial semiconductor layer/SOI layer according to an embodiment of the present invention.
Figure 6:
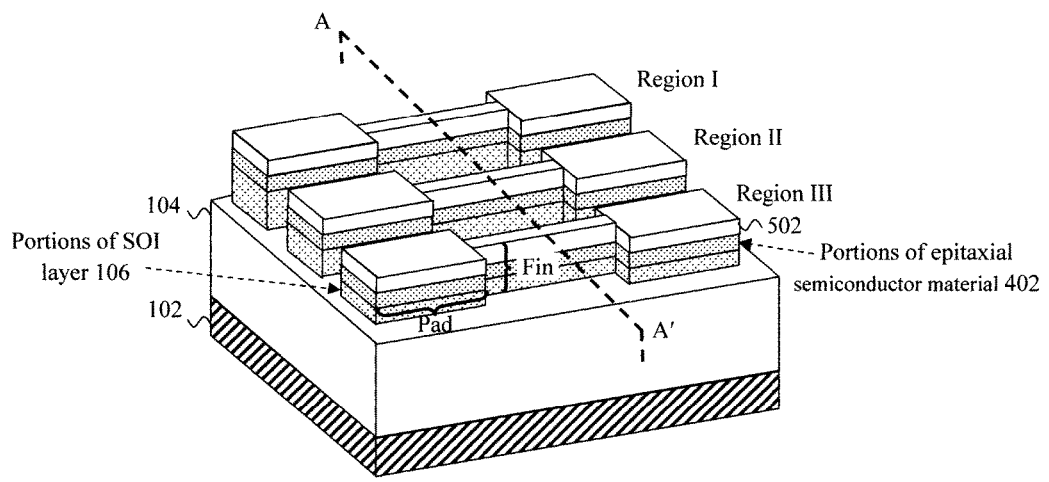
FIG. 6 is a three-dimensional diagram illustrating how anchor pads (along with the fins) can be patterned in the epitaxial semiconductor layer/SOI layer according to an embodiment of the present invention.

An exemplary three-dimensional view of the hardmask 502, and fins and pads patterned in the epitaxial semiconductor material 402 and stepped SOI layer 106 is shown in FIG. 6. By way of example, FIG. 5 is representative of a cross-sectional cut through line A-A' in FIG. 6. In the example shown in the figures there is one fin/nanowire (and set of pads) per region of the wafer. This is merely for ease and clarity of depiction, and embodiments are anticipated herein where multiple fins/nanowires are present in each of the regions.

As shown in FIG. 6, the hardmask 502 has the shape (footprint) and location of the fins and pads. Further, due to the varying thickness of the SOI layer 106, the epitaxial semiconductor material 402 and the hardmask 502 are at varying heights above the oxide layer 104. Following the fin/pad etch, the hardmask 502 can be removed.

Figure 7:
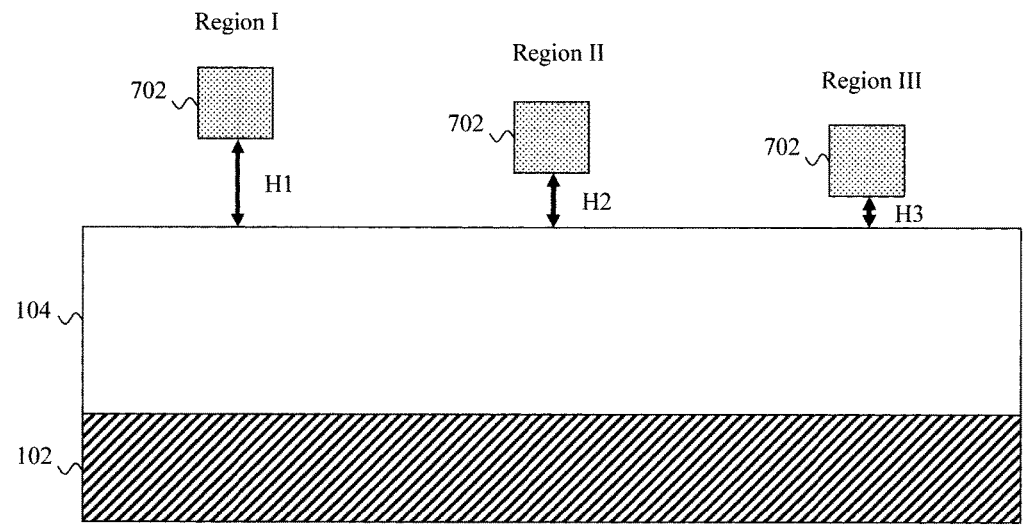
FIG. 7 is a cross-sectional diagram illustrating the SOI layer having been removed from the fins selective to the epitaxial semiconductor layer to release the epitaxial layer from the fins, and thereby forming suspended nanowires of the device according to an embodiment of the present invention.

Switching back to a cross-sectional view, as shown in FIG. 7 the (sacrificial) SOI layer 106 is next removed from the fins selective to the epitaxial semiconductor material 402. The epitaxial semiconductor material 402 now released from the fins forms nanowires 702 of the device that are suspended (at varying heights) above the oxide layer 104. In the example depicted, based on the SOI layer 106 having thicknesses T1, T2, and T3 wherein T1>T2>T3 (see above), the nanowires 702 are suspended at heights H1, H2, and H3 in Region I, Region II, and Region III of the wafer, respectively, wherein H1>H2>H3.

According to an exemplary embodiment, the SOI layer 106 is formed from SiGe, the epitaxial semiconductor material 402 is formed from Si, and the SOI layer 106 is removed from the fins selective to the epitaxial semiconductor material 402 using a chemical etchant that exploits the lower oxidation potential of the SiGe SOI layer 106 as compared to the epitaxial semiconductor material 402. Examples of such an etchant include, but are not limited to, a 1:2:3 mixture of HF:hydrogen peroxide ($H_2O_2$):acetic acid ($CH_3COOH$), or a mixture of sulfuric acid ($H_2SO_4$) and $H_2O_2$. Alternatively, SOI layer 106 can be removed selective to the epitaxial semiconductor material 402 using a dry etching process such as oxygen ($O_2$) plasma etching or plasma chemistries typically used for etching.

In order to anchor the pads to the wafer, it is desirable for the SOI layer 106 to remain beneath the pads. During the removal of the SOI layer 106 from the fins there will likely be some lateral etching of the SOI layer 106 that makes up the pads (see for example FIG. 6—described above). The amount of this lateral etching is however minimal since the amount of the SOI layer 106 under the pads is relatively larger than the amount of the SOI layer 106 in the fins. Thus, after performing an etch sufficient to release the nanowires 702 from the fins a majority of the SOI layer 106 beneath the pads will remain.

Once suspended, the nanowires 702 are optionally re-shaped to give them a circular cross-sectional shape. See FIG. 8. By way of example, this re-shaping can be achieved by annealing the nanowires 702 in a hydrogen-containing atmosphere. Exemplary annealing temperatures are from about 600 degrees Celsius (° C.) to about 1,000° C., and a hydrogen pressure of from about 600 torr to about 700 torr may be employed. Exemplary techniques for re-shaping nanowires may be found, for example, in U.S. Pat. No. 7,884,004 issued to Bangsaruntip et al., entitled "Maskless Process for Suspending and Thinning Nanowires," the contents of which are incorporated by reference as if fully set forth herein. The nanowires 702 are also thinned during this re-shaping process. According to an exemplary embodiment, once re-shaped the nanowires 702 have a circular cross-sectional shape with a cross-sectional diameter of from about 5 nm to about 20 nm, and ranges therebetween. If so desired, it is also possible to further thin the nanowires using, e.g., a high-temperature oxidation process. The process for thinning nanowires using high-temperature oxidation is described, for example, in U.S. Pat. No. 8,927,397 issued to Chang et al., entitled "Diode Structure and Method for Gate All Around Silicon Nanowire Technologies" (hereinafter "U.S. Pat. No. 8,927,397"), the contents of which are incorporated by reference as if fully set forth herein.

Figure 8:
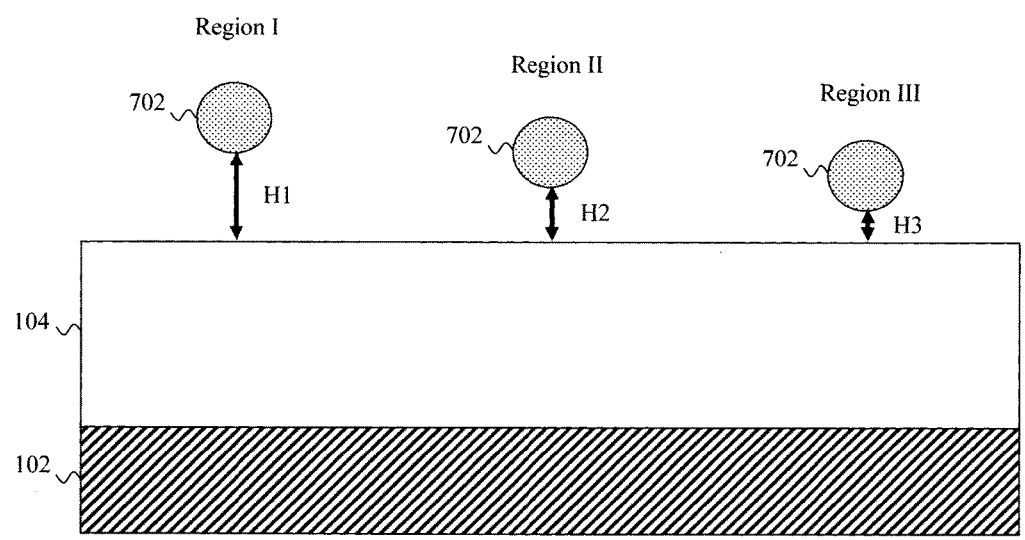
FIG. 8 is a cross-sectional diagram illustrating the nanowires having been re-shaped to give them a circular cross-sectional shape according to an embodiment of the present invention.
Figure 9:
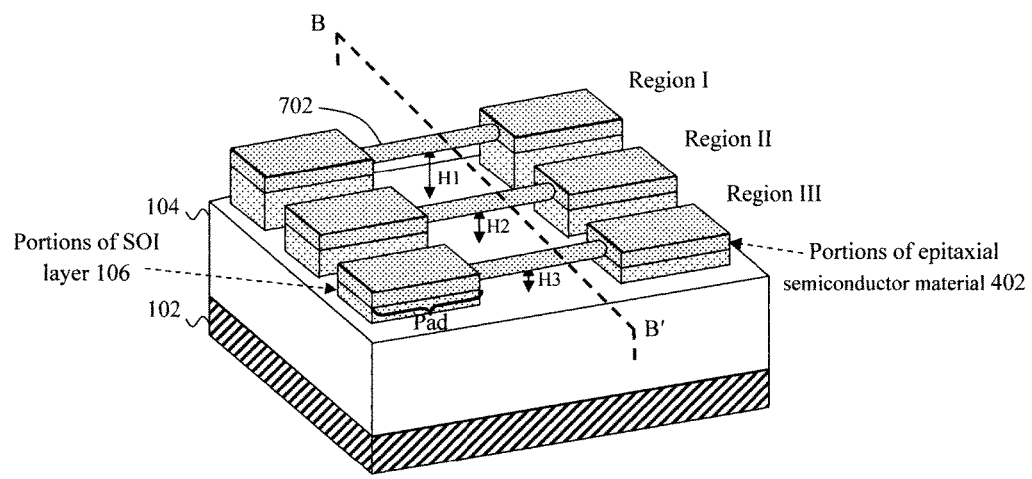
FIG. 9 is a three-dimensional diagram illustrating the suspended/re-shaped nanowires and pads according to an embodiment of the present invention.

For clarity, FIG. 9 provides a three-dimensional representation of the nanowires 702 suspended at different heights over the oxide layer 104. The nanowires 702 in this example have been re-shaped as described above, and are anchored to the wafer by the pads at opposing ends of the nanowires 702. See FIG. 9. By way of example only, FIG. 8 is representative of a cross-sectional cut through line B-B' in FIG. 9.

The nanowires 702 will serve as the basis for one or more nanowire-based transistors which will be formed on the wafer. Each of the transistors will have a source and a drain interconnected by the nanowires 702. A gate stack or stacks will at least partially surround a portion of each of the nanowires 702. The term "gate stack," as used herein refers to the layers of materials formed on and around the nanowires 702 which collectively form the gates of the nanowire-based transistors. In the present example, each gate stack will include a gate dielectric, a workfunction metal and a poly-silicon (Poly-Si) layer. The portions of the nanowires 702 surrounded by the gate stack will serve as channel regions of the transistors. Portions of the nanowires extending out from the gate stack, and the pads, will serve as the source and drain regions of the transistors. Collectively, these transistors will make up the present nanowire CMOS device. In the present example, one nanowire-based transistor will be formed in each region of the wafer. However, this is merely one exemplary configuration, and nanowire CMOS devices are contemplated herein where multiple transistors are formed (using the same process described herein) in one or more of the regions.

As highlighted above, the Vt of the nanowire-based transistors will be regulated based on the amount of a workfunction-setting metal (or simply workfunction metal) present in the gate stacks. The amount of workfunction metal present in the gate stacks is controlled by the suspension heights of the nanowires 702. This process for workfunction engineering in the gate stacks is now described in detail.

Figure 10:
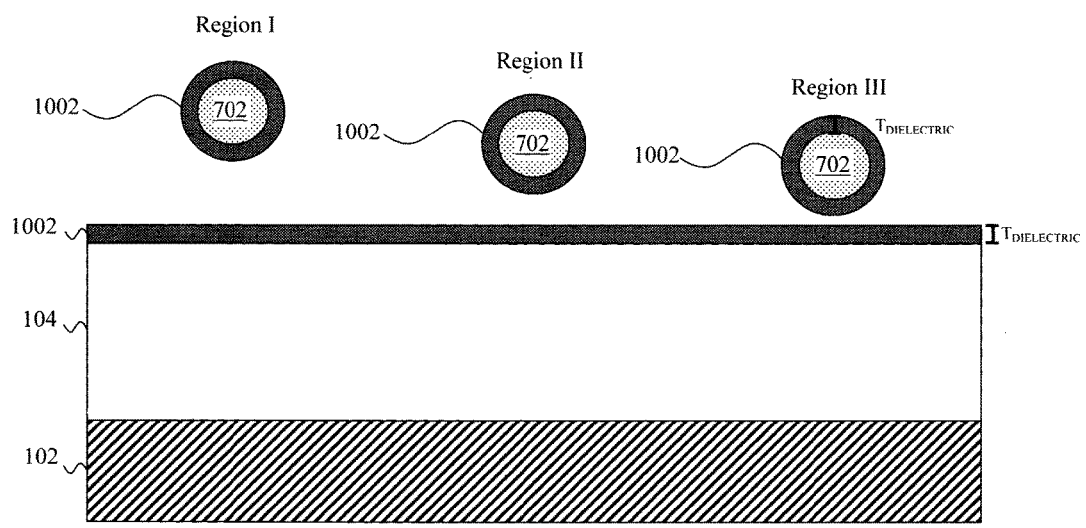
FIG. 10 is a cross-sectional diagram illustrating a conformal gate dielectric having been blanket deposited on the wafer and surrounding the nanowires according to an embodiment of the present invention.

Switching back to a cross-sectional view through the nanowires 702, FIG. 10 illustrates a conformal gate dielectric 1002 having been deposited on the nanowires 702 and on the wafer (i.e., on a side of the oxide layer 104 opposite the substrate 102). Use of a conformal deposition process for placing the gate dielectric insures that the gate dielectric is deposited around the (suspended) nanowires 702 including within the gap under the nanowires 702 between the nanowires 702 and the oxide layer 104.

Suitable conformal deposition processes include, but are not limited to, atomic layer deposition (ALD) or chemical vapor deposition (CVD). Suitable gate dielectric materials include, but are not limited to, high-κ dielectric materials such as hafnium oxide ($HfO_2$) or lanthanum oxide ($LaO_2$). According to an exemplary embodiment, the same dielectric material is deposited around each of the nanowires 702 in a single conformal deposition step. However, if so desired one might optionally vary the gate dielectric material used in the different nanowire-based transistors being formed.

As shown in FIG. 10, the gate dielectric 1002 is deposited on the nanowires 702 and on the wafer to a uniform thickness $T_{DIELECTRIC}$. According to an exemplary embodiment, $T_{DIELECTRIC}$ is from about 1 nm to about 5 nm, and ranges therebetween. The thickness of the gate dielectric 1002 (and other gate stack materials) deposited in this manner will reduce the gap under the nanowires 702 between the nanowires 702 and the underlying oxide layer 104, thereby limiting the amount of the gate stack materials (most notably in this case the workfunction metal) that can placed around the nanowires 702. In the example shown, following deposition of the gate dielectric 1002 there is still a gap present under each of the nanowires 702. It is notable however that embodiments are contemplated herein where the formation of the gate dielectric 1002 closes off the gap underneath one or more of the nanowires 702 (such as those in Region III of the instant example which have the lowest suspension height). In that case, the gate dielectric 1002 deposited on the nanowires 702 will be in contact with the gate dielectric 1002 deposited on the oxide layer 104. This configuration permits the oxide layer 104 to serve as an additional source of oxygen that will result in a greater amount of oxide growth at the interface of the nanowires 702 and the gate dielectric 1002. See, for example, FIG. 9 of Ser. No. 14/671,041.

Figure 11:
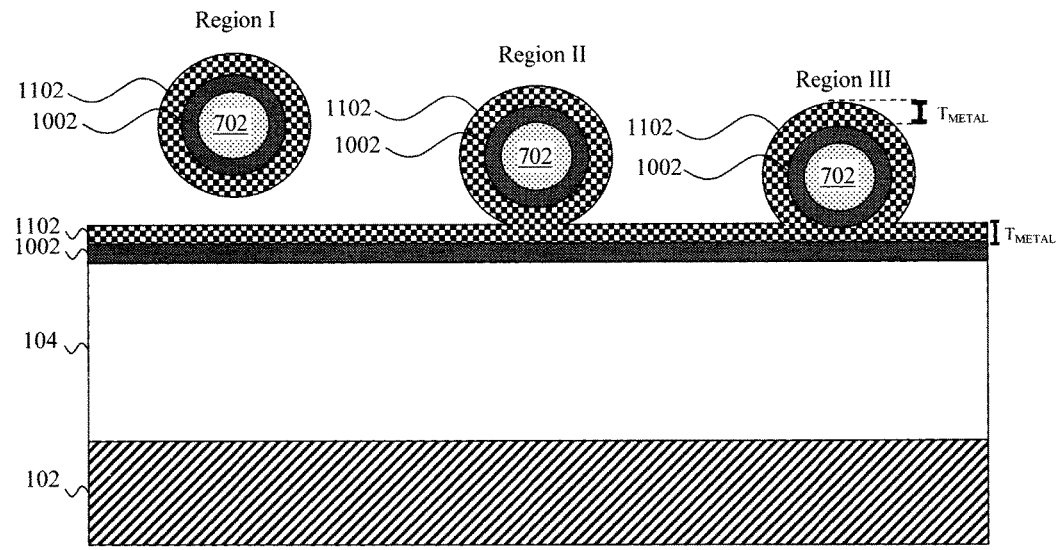
FIG. 11 is a cross-sectional diagram illustrating a conformal gate metal layer having been blanket deposited on the conformal gate dielectric both on the wafer and around the nanowires, wherein a suspension height of the nanowires determines whether or not the conformal gate metal layer on the nanowires merges with the conformal gate metal layer on the wafer according to an embodiment of the present invention.

Next, as shown in FIG. 11, a conformal workfunction metal 1102 is deposited on the gate dielectric 1002 both on the wafer and around the nanowires 702. Specifically, using a conformal deposition process, such as ALD or CVD, the conformal workfunction metal 1102 is deposited to a uniform thickness $T_{METAL}$ on the wafer (i.e., on a side of the gate dielectric 1002 opposite the oxide layer 104) and around the nanowires 702 (i.e., on a side of the gate dielectric 1002 opposite the nanowires 702). According to an exemplary embodiment, conformal workfunction metal 1102 is deposited to a uniform thickness $T_{METAL}$ of from about 5 nm to about 20 nm, and ranges therebetween, on the gate dielectric 1002 over the oxide layer 104 and around the nanowires.

The particular workfunction metal employed can vary depending on whether an n-channel or p-channel nanowire-based transistor is desired. Suitable n-type workfunction metals include, but are not limited to, lanthanum, titanium, and tantalum. Suitable p-type workfunction metals include, but are not limited to, aluminum, dysprosium, gadolinium, and ytterbium.

In the example shown illustrated in the figures, based on the varied suspension height of the nanowires 702, after the deposition of the workfunction metal 1102 a gap is still present beneath the nanowire(s) 702 in Region I of the wafer, while the workfunction metal 1102 around the nanowires 702 merges with the workfunction metal 1102 deposited on the wafer in Region II and Region III of the wafer. Further, based on the nanowire(s) in Region II of the wafer being suspended at a greater height than in Region III of the wafer, the amount of the workfunction metal 1102 deposited around and under the nanowire(s) in Region II of the wafer is greater than the amount of the workfunction metal 1102 deposited around and under the nanowire(s) in Region III of the wafer.

Specifically, in Region II and Region III of the wafer the merging of the workfunction metal 1102 deposited around the nanowire(s) 702 with the workfunction metal 1102 deposited on the wafer results in a greater amount of the workfunction metal 1102 present under the nanowires as compared to in Region I of the wafer. The greater nanowire suspension height in Region II as compared to in Region III of the wafer permits more of the workfunction metal 1102 to be deposited around the nanowires before merging with the workfunction metal 1102 on the wafer occurs. As a result, the greatest amount of workfunction metal 1102 is present around and beneath the nanowire(s) 702 in Region II of the wafer, and the least amount of workfunction metal 1102 is present around and beneath the nanowire(s) 702 in Region I of the wafer. The amount of workfunction metal 1102 present around and beneath the nanowire(s) 702 in Region III of the wafer is between that that of Region I and Region II.

As provided above, the amount of workfunction metal present affects the Vt of the corresponding the nanowire-based transistors, i.e., wherein the greater the amount of workfunction setting gate metal present–the lower the Vt. Thus in the present example, since the amount of workfunction metal present (amt.WF) is greater in Region II than in Region III, and the amount of workfunction metal present (amt.WF) is greater in Region III than in Region I (i.e., amt.$WF_{REGION\ II}$>amt.$WF_{REGION\ III}$>amt.$WF_{REGION\ I}$), then the Vt of the transistors formed in Region II will be less than those of the transistors formed in Region III of the wafer, and the Vt of the transistors formed in Region III of the wafer will be less than those of the transistors formed in Region I of the wafer (i.e., $Vt_{REGION\ II}$<$Vt_{REGION\ III}$<$Vt_{REGION\ I}$).

Thus, according to the present techniques, the Vt of the nanowire-based transistors can be effectively regulated based on the amount of the workfunction metal present in the gate stacks formed on and around the nanowires 702. In turn, the amount of the workfunction metal present on and around the nanowires is, as provided above, regulated based on the suspension height of the nanowires.

Figure 12:
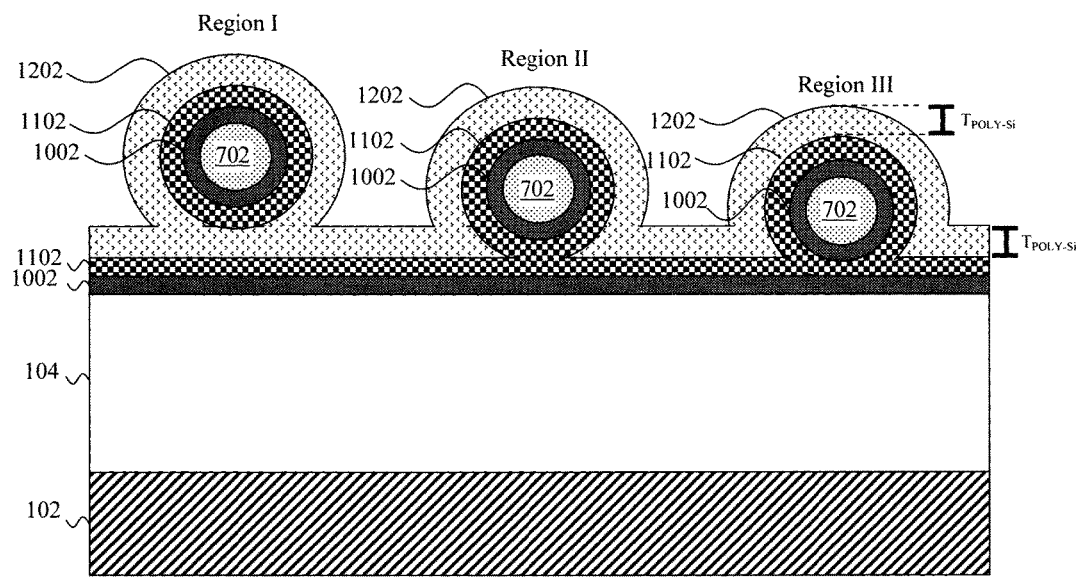
FIG. 12 is a cross-sectional diagram illustrating a conformal polysilicon layer having been blanket deposited on the conformal gate metal layer both on the wafer and around the nanowires according to an embodiment of the present invention.

Next, as shown in FIG. 12, a conformal poly-Si layer 1202 is then blanket deposited on the workfunction metal 1102 both on the wafer and around the nanowires 702. Specifically, using a conformal deposition process, such as ALD or CVD, the poly-Si layer 1202 is deposited to a uniform thickness $T_{POLY-Si}$ on the wafer (i.e., on a side of the workfunction metal 1102 opposite the gate dielectric 1002) and around the nanowires 702 (i.e., on a side of the workfunction metal 1102 opposite the gate dielectric 1002). According to an exemplary embodiment, poly-Si layer 1202 is deposited to a uniform thickness $T_{POLY-Si}$ of from about 10 nm to about 30 nm, and ranges therebetween, both on the wafer and around the nanowires 702.

Based on the varied suspension height of the nanowires 702, the poly-Si layer 1202 is only present underneath the nanowires 702 in Region I of the wafer. In Region II and Region III of the wafer, the workfunction metal 1102 has already closed off the gap beneath the nanowires 702 in those regions.

Figure 13:
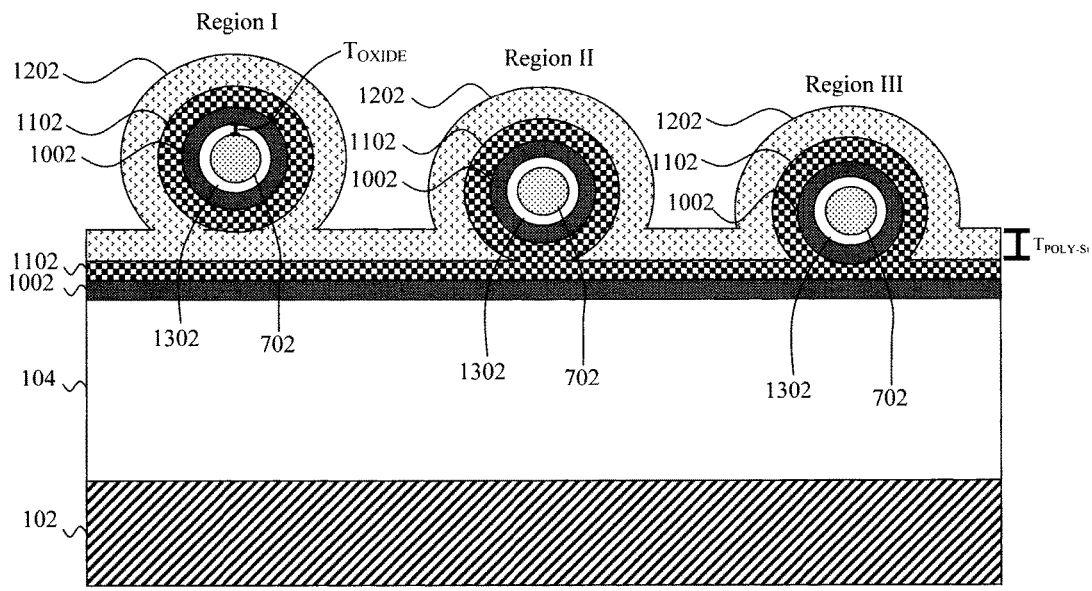
FIG. 13 is a cross-sectional diagram illustrating an anneal in an oxygen ambient having been used to form a conformal oxide layer at the interface between the gate dielectric and the nanowires according to an embodiment of the present invention.

Finally, as shown in FIG. 13, an anneal in an oxygen ambient is then used to form a conformal oxide layer 1302 at the interface between the gate dielectric 1002 and the nanowires 702. Oxidation occurs at the interface between the conformal gate dielectric and the nanowires due to the relative oxygen affinity of the gate dielectric (e.g., $HfO_2$) versus the semiconductor material in the nanowires (Si, for example, steals oxygen from $HfO_2$ and makes it slightly sub stoichiometric) and metal catalyzation of the oxide growth. Thus, the conformal oxide layer formed is an oxide of the semiconductor material in the nanowires, e.g., $SiO_2$ for Si wires, germanium dioxide ($GeO_2$) or silicon germanium oxide for germanium (Ge) or silicon germanium (SiGe) nanowires, respectively—see below. According to an exemplary embodiment, the anneal is performed at a temperature of from about 200° C. to about 500° C., and ranges therebetween, for a duration of from about 5 minutes to about 15 minutes, and ranges therebetween.

In the example depicted in FIG. 13, the oxide layer 1302 formed around each of the nanowires 702 has a uniform thickness $T_{OXIDE}$. This is due to the oxidation being performed simultaneously and under the same conditions for each of the transistors, and further due to the fact that—in all three regions of the wafer—the gate dielectric 1002 around the nanowires 702 is not in direct physical contact with the underlying oxide layer 104. Namely, in all three regions there is at least one other gate stack material separating the gate dielectric 1002 around the nanowires 702 from the gate dielectric 1002 on the wafer.

However, if any region the gate dielectric 1002 around the nanowires 702 was in direct physical contact with the underlying oxide layer 104 (which would be the case if the gate dielectric 1002 around the nanowires 702 merged with the gate dielectric 1002 on the wafer) then the oxide layer 104 could serve as an additional source of oxygen that would diffuse through the (e.g., high-k dielectric) to the interface between the gate dielectric 1002 and the nanowires 702. This would result in a thicker oxide layer 1302 being formed around the nanowires 702 in that region. For a description and depiction of a thicker oxide being formed at the nanowire/gate dielectric interface see Ser. No. 14/671,041.

As provided above, other techniques are contemplated herein for varying the suspension height of the nanowires. Namely, according to another exemplary embodiment, the underlying oxide is undercut beneath the nanowires to release/suspend the nanowires, wherein the depth of the undercut is varied to suspend the nanowires at different heights. This embodiment is now described by way of reference to FIGS. 14-25.

Figure 14:
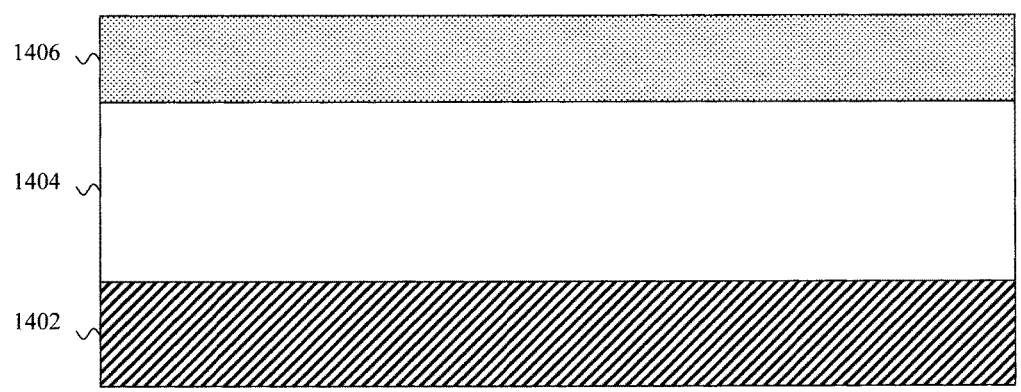
FIG. 14 is a cross-sectional diagram illustrating an alternative starting structure for forming a nanowire CMOS device including a SOI wafer having a SOI layer (in which nanowires and pads will be formed) separated from a substrate by an oxide layer according to an embodiment of the present invention.

Beginning with FIG. 14, the starting structure in this example is an SOI wafer having a SOI layer 1406 separated from a substrate 1402 by an oxide (i.e., a BOX or HDP oxide) 1404. By comparison with the exemplary process flow presented above, in this case the nanowires and anchor pads will be formed in the SOI layer 1406. By way of example only, the SOI layer 1406 may be formed from a semiconductor material such as Si, germanium (Ge), or SiGe.

Standard lithography and etching can then be used to pattern nanowires (and pads—see below) in the SOI layer 1406. See FIG. 15. According to an exemplary embodiment, a hardmask 1504 is formed on the SOI layer 1406 with the footprint and location of the nanowires 1502. An etch, such as RIE, is then used to pattern the nanowires 1502 (and pads) in the SOI layer 1406.

Figure 15:
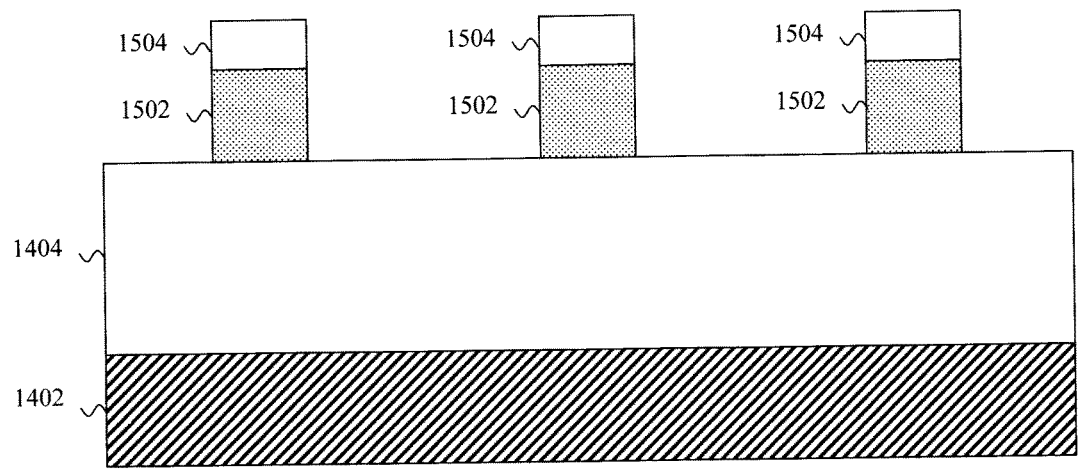
FIG. 15 is a cross-sectional diagram illustrating nanowires having been patterned in the SOI layer according to an embodiment of the present invention.
Figure 16:
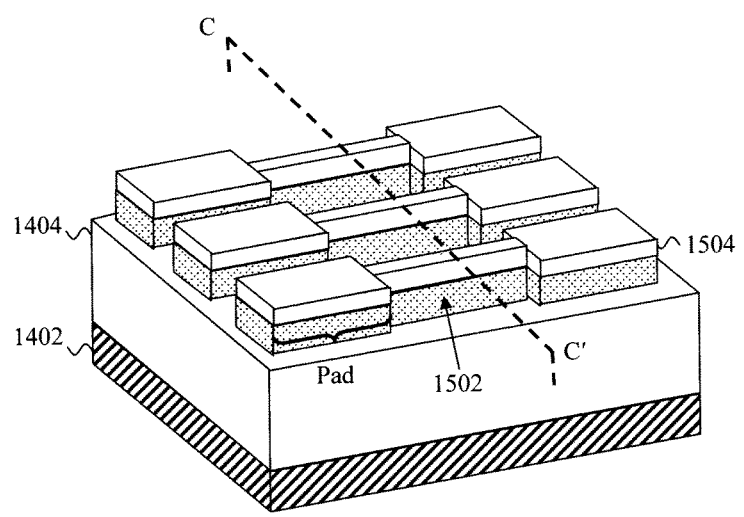
FIG. 16 is a three-dimensional diagram illustrating how anchor pads (along with the fins) can be patterned in the SOI layer according to an embodiment of the present invention.

An exemplary three-dimensional view of the hardmask 1504, and nanowires 1502 and pads patterned in the SOI layer 1406 is shown in FIG. 16. By way of example only, FIG. 15 is representative of a cross-sectional cut through line C-C' in FIG. 16. In the example shown in the figures there is one nanowire (and set of pads) per region of the wafer. This is merely for ease and clarity of depiction, and embodiments are anticipated herein where multiple nanowires are present in each of the regions. As shown in FIG. 16, the nanowires 1502 and pads preferably have a ladder-like configuration wherein the nanowires are arranged like the rungs of a ladder.

Figure 17:
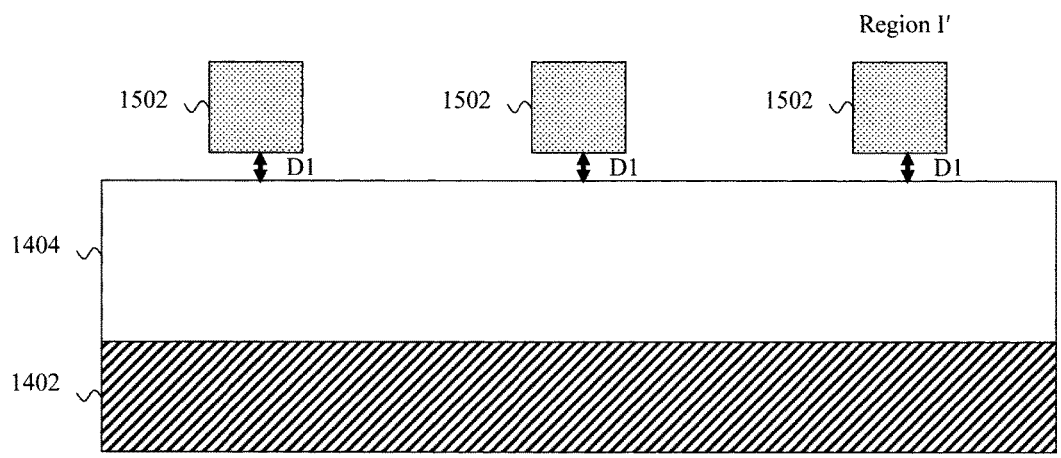
FIG. 17 is a cross-sectional diagram illustrating the oxide layer have been recessed to a first depth D1 beneath the nanowires in a first Region I' of the wafer, suspending the nanowires over the oxide layer according to an embodiment of the present invention.
Figure 18:
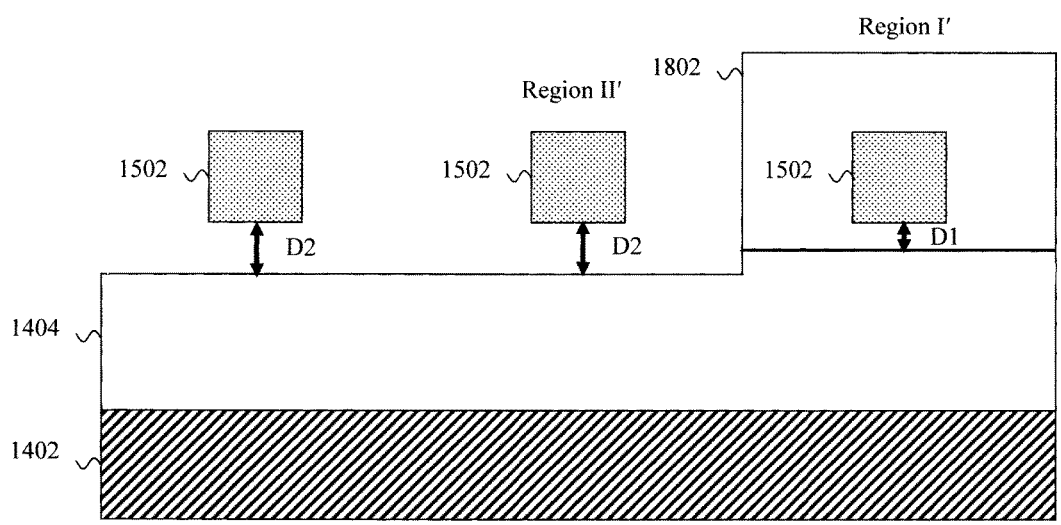
FIG. 18 is a cross-sectional diagram illustrating the oxide layer having been recessed to a second depth D2 in a second Region II' of the wafer according to an embodiment of the present invention.
Figure 19:
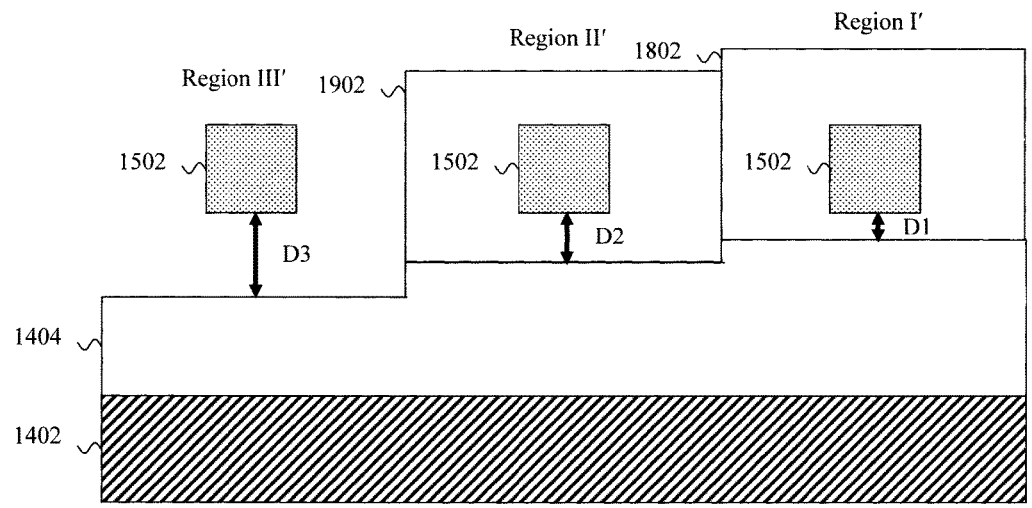
FIG. 19 is a cross-sectional diagram illustrating the oxide layer having been recessed to a third depth D3 in a third Region III' of the wafer according to an embodiment of the present invention.

Using a series of masking and etching steps, the oxide layer 1404 is then recessed to differing depths beneath the nanowires thereby i) releasing the nanowires 1502 from the underlying oxide layer 1404 and ii) suspending the nanowires 1502 at different heights over the oxide layer 1404. Namely, as shown in FIG. 17, a first etch is performed to recess the oxide layer 1404 to a first depth D1 beneath each of the nanowires 1502.

According to an exemplary embodiment, this recess etch of the oxide layer 1404 is carried out using an isotropic etching process such as diluted hydrofluoric acid (DHF). At room temperature, a 100:1 DHF etches from about 2 nm to about 3 nm of the oxide layer 1404 per minute. Thus, the timing of the etch can be controlled to control by how much the oxide layer 1404 is recessed (undercut) beneath the nanowires 1502.

To maintain the depth of the oxide layer 1404 recess in a first Region I' of the wafer at D1, a mask 1802 is formed covering Region I' of the wafer to prevent further etching of the oxide layer 1404 in that region. See FIG. 18. According to an exemplary embodiment, mask 1802 is formed from a conventional photoresist or a nitride masking material such as silicon nitride (SiN). A timed etch (e.g., in DHF) is then used to undercut the oxide layer 1404 to a second depth D2 beneath the nanowires 1502 in a second Region II' of the wafer.

The oxide layer 1404 is now recessed to two different depths beneath the nanowires, i.e., depth D1 in Region I' of the wafer and depth D2 in Region II' of the wafer—wherein D2>D1. To further illustrate the present process, the oxide layer 1404 is optionally further recessed to a depth D3 in a third Region III' of the wafer. See FIG. 19. The same general process is employed to recess the oxide layer 1404 in this third region of the wafer. Namely, a mask 1902 is formed over the Region II' of the wafer. It is assumed that the mask 1802 remains in place covering Region I'. A timed etch is then used to further recess the oxide layer 1404 beneath the nanowires 1502 in Region III' of the wafer to a third depth D3 beneath the nanowires 1502 in a third Region III' of the wafer.

Following the final recess etch, the masks 1802, 1902, etc. can be removed. In the example depicted in the figures, the nanowires 1502 are now suspended at three different heights over the oxide layer 1404, i.e., H1', H2', and H3' in regions I', II', and III' of the wafer, respectively. See below.

Figure 20:
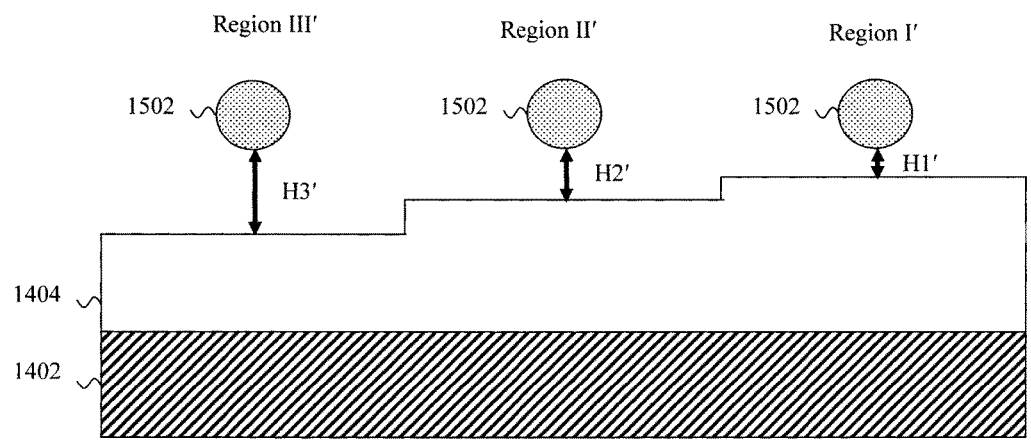
FIG. 20 is a cross-sectional diagram illustrating the nanowires having been re-shaped to give them a circular cross-sectional shape according to an embodiment of the present invention.

The same basic process flow as described above is then employed to (optionally) re-shape the nanowires 1502 and form a gate stack surrounding the nanowires. Namely, as shown in FIG. 20, an optional re-shaping of the nanowires 1502 may be performed to give them a circular cross-sectional shape. By way of example, this re-shaping can be achieved by annealing the nanowires 1502 in a hydrogen-containing atmosphere. Suitable conditions (i.e., temperature, hydrogen pressure, duration, etc.) were provided above.

The nanowires 1502 are also thinned during this re-shaping process. According to an exemplary embodiment, once re-shaped the nanowires 1502 have a circular cross-sectional shape with a cross-sectional diameter of from about 5 nm to about 20 nm, and ranges therebetween. Further thinning of the nanowires 1502 may be performed, if so desired, using for example a high-temperature oxidation process. See above.

Figure 21:
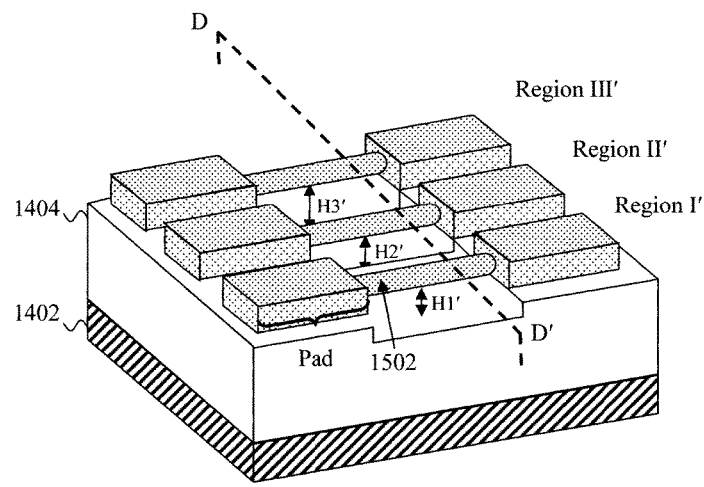
FIG. 21 is a three-dimensional diagram illustrating the suspended/re-shaped nanowires and pads according to an embodiment of the present invention.

For clarity, FIG. 21 provides a three-dimensional representation of the oxide layer 1404 having been recessed to three different depths beneath the nanowires 1502. As a result, the nanowires 1502 are suspended at three different heights H1', H2', and H3' over the oxide layer 1404 in Region I', Region II', and Region III' of the wafer, respectively. The nanowires 1502 in this example have been re-shaped as described above, and are anchored to the wafer by pads at opposing ends of the nanowires 1502. See FIG. 21. By way of example only, FIG. 20 is representative of a cross-sectional cut through line D-D' in FIG. 21.

As above, the nanowires 1502 will serve as the basis for one or more nanowire-based transistors which will be formed on the wafer. A gate stack or stacks will at least partially surround a portion of each of the nanowires 1502. The portions of the nanowires 1502 surrounded by the gate stack will serve as channel regions of the transistors. Portions of the nanowires extending out from the gate stack, and the pads, will serve as the source and drain regions of the transistors. Collectively, these transistors will make up the present nanowire CMOS device. In the present example, one nanowire-based transistor will be formed in each region of the wafer. However, this is merely one exemplary configuration, and nanowire CMOS devices are contemplated herein where multiple transistors are formed (using the same process described herein) in one or more of the regions.

Figure 22:
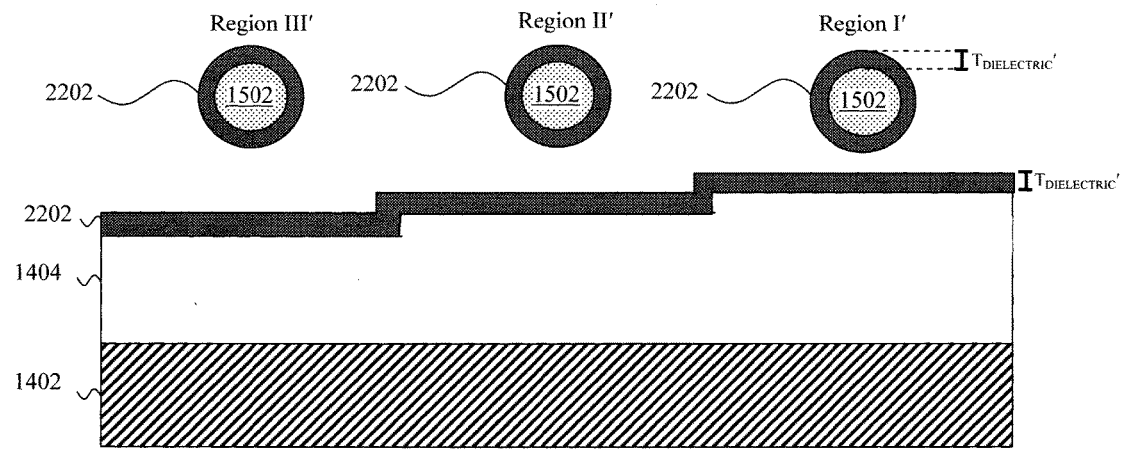
FIG. 22 is a cross-sectional diagram illustrating a conformal gate dielectric having been blanket deposited on the wafer and surrounding the nanowires according to an embodiment of the present invention.

Switching back to a cross-sectional view through the nanowires 1502 in FIG. 22, to begin the gate stack fabrication process a conformal gate dielectric 2202 is deposited on the nanowires 1502 and on the wafer (i.e., on a side of the oxide layer 1404 opposite the substrate 1402). Use of a conformal deposition process (such as ALD or CVD) for placing the gate dielectric insures that the gate dielectric is deposited around the (suspended) nanowires 1502 including within the gap under the nanowires 1502 between the nanowires 1502 and the oxide layer 1404.

Suitable gate dielectric materials include, but are not limited to, high-κ dielectric materials such as $HfO_2$ or $LaO_2$. According to an exemplary embodiment, the same dielectric material is deposited around each of the nanowires 1502 in a single conformal deposition step. However, if so desired one might optionally vary the gate dielectric material used in the different nanowire-based transistors being formed.

As shown in FIG. 22, the gate dielectric 2202 is deposited on the nanowires 1502 and on the wafer to a uniform thickness $T_{DIELECTRIC}'$. According to an exemplary embodiment, $T_{DIELECTRIC}$ is from about 1 nm to about 5 nm, and ranges therebetween. The thickness of the gate dielectric 2202 (and other gate stack materials) deposited in this manner will affect by how much the gap is reduced between the nanowires 1502 and the underlying oxide layer 1404, thereby limiting the amount of the gate stack materials (most notably in this case the workfunction metal) that can placed on and around the nanowires 1502. In the example shown in FIG. 22, following deposition of the gate dielectric 2202 there is still a gap present under each of the nanowires 1502. It is notable however that embodiments are contemplated herein where the formation of the gate dielectric 2202 (based for example on the thickness of the gate dielectric 2202 and/or the suspension height of the nanowires 1502) closes off the gap underneath one or more of the nanowires 1502 (such as those in Region I' of the instant example which have the lowest suspension height). In that case, the gate dielectric 2202 deposited on the nanowires 1502 will be in contact with (i.e., merges with) the gate dielectric 2202 deposited on the oxide layer 1404. As described above, this configuration permits the oxide layer 1404 to serve as an additional source of oxygen that will result in a greater amount of oxide growth at the interface of the nanowires 1502 and the gate dielectric 2202. See, for example, FIG. 9 Ser. No. 14/671,041.

Figure 23:
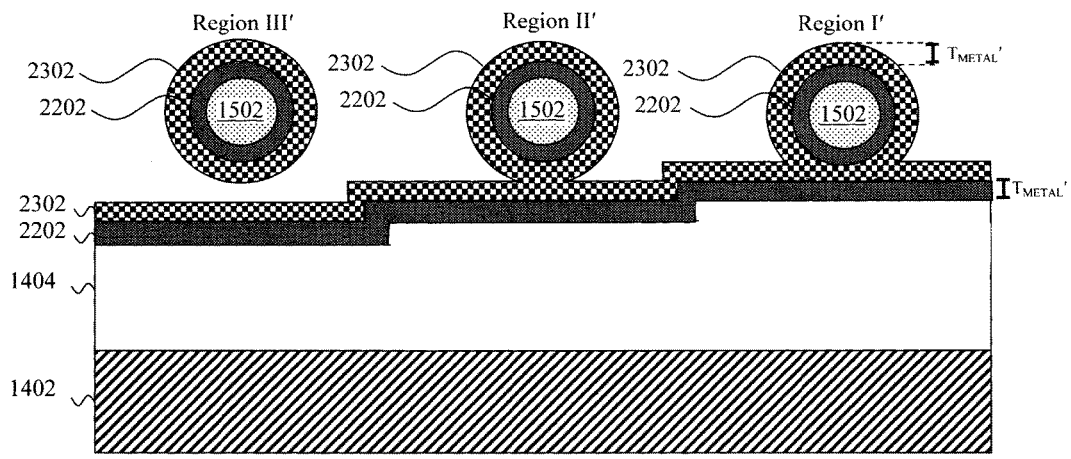
FIG. 23 is a cross-sectional diagram illustrating a conformal gate metal layer having been blanket deposited on the conformal gate dielectric both on the wafer and around the nanowires, wherein a suspension height of the nanowires determines whether or not the conformal gate metal layer on the nanowires merges with the conformal gate metal layer on the wafer according to an embodiment of the present invention.

Next, as shown in FIG. 23, a conformal workfunction metal 2302 is deposited on the gate dielectric 2202 both on the wafer and around the nanowires 1502. Specifically, using a conformal deposition process, such as ALD or CVD, the conformal workfunction metal 2302 is deposited to a uniform thickness $T_{METAL}'$ on the wafer (i.e., on a side of the gate dielectric 2202 opposite the oxide layer 1404) and around the nanowires 1502 (i.e., on a side of the gate dielectric 2202 opposite the nanowires 1502). According to an exemplary embodiment, conformal workfunction metal 2302 is deposited to a uniform thickness $T_{METAL}'$ of from about 5 nm to about 20 nm, and ranges therebetween, on the gate dielectric 2202 over the oxide layer 1404 and around the nanowires.

As provided above, suitable n-type workfunction metals include, but are not limited to, lanthanum, titanium, and tantalum. Suitable p-type workfunction metals include, but are not limited to, aluminum, dysprosium, gadolinium, and ytterbium.

In the example shown illustrated in the figures, based on the varied suspension height of the nanowires 1502, after the deposition of the workfunction metal 2302 a gap is still present beneath the nanowire(s) 1502 in Region III' of the wafer, while the workfunction metal 2302 around the nanowires 1502 merges with the workfunction metal 2302 deposited on the wafer in Region II' and Region I'. Further, based on the nanowire(s) being suspended at a greater height in Region II' than in Region I' of the wafer, the amount of the workfunction metal 2302 deposited around and under the nanowire(s) 1502 in Region II' of the wafer is greater than the amount of the workfunction metal 2302 deposited around and under the nanowire(s) in Region I' of the wafer.

Specifically, the merging of the workfunction metal 2302 deposited around the nanowire(s) 1502 with the workfunction metal 2302 deposited on the wafer in Region II' and Region I' of the wafer results in a greater amount of the workfunction metal 2302 being present under the nanowires 1502 than in Region III' of the wafer. The greater nanowire suspension height in Region II' as compared to in Region I' of the wafer permits more of the workfunction metal 2302 to be deposited around the nanowires before merging with the workfunction metal 2302 on the wafer occurs. As a result, the greatest amount of workfunction metal 2302 is present around and beneath the nanowire(s) 1502 in Region II' of the wafer, and the least amount of workfunction metal 2302 is present around and beneath the nanowire(s) 1502 in Region III' of the wafer. In Region I' of the wafer, the amount of workfunction metal 2302 present around and beneath the nanowire(s) 1502 is between that of Region II' and Region III'.

As provided above, the greater the amount of workfunction setting gate metal present—the lower the Vt. Thus in the present example, since the amount of workfunction metal present (amt.WF) is greater in Region II' than in Region I', and the amount of workfunction metal present (amt.WF) is greater in Region I' than in Region III' (i.e., amt.WF$_{REGION\ II'}$>amt.WF$_{REGION\ I'}$>amt.WF$_{REGION\ III'}$), then the Vt of the transistors formed in Region II' will be less than those of the transistors formed in Region I' of the wafer, and the Vt of the transistors formed in Region I' of the wafer will be less than those of the transistors formed in Region III' of the wafer (i.e., Vt$_{REGION\ II'}$<Vt$_{REGION\ I'}$<Vt$_{REGION\ III'}$).

Thus, according to the present techniques, the Vt of the nanowire-based transistors can be effectively regulated based on the amount of the workfunction metal present in the gates stacks formed on and around the nanowires 1502. In turn, the amount of the workfunction metal present on and around the nanowires is, as provided above, regulated based on the suspension height of the nanowires over the oxide layer 1404.

Figure 24:
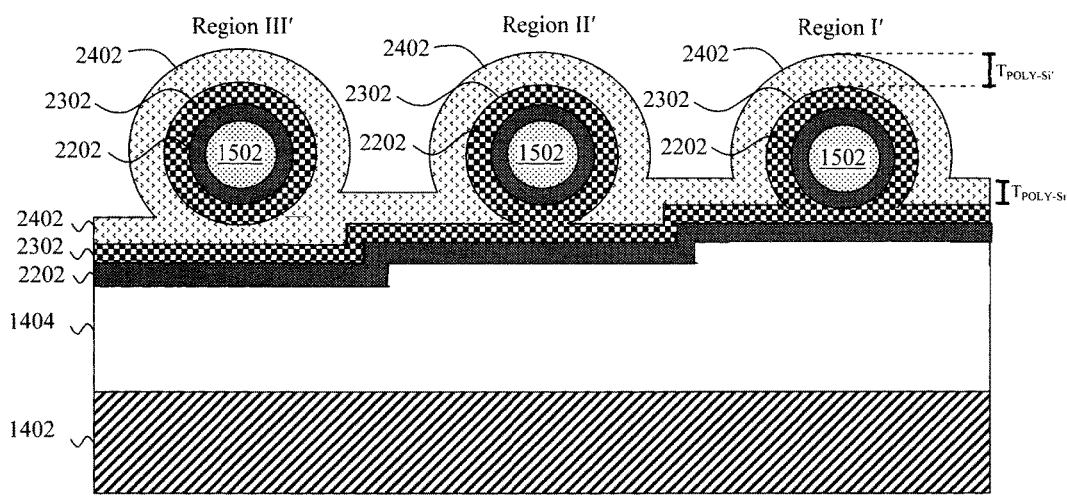
FIG. 24 is a cross-sectional diagram illustrating a conformal polysilicon layer having been blanket deposited on the conformal gate metal layer both on the wafer and around the nanowires according to an embodiment of the present invention.

Next, as shown in FIG. 24, a conformal poly-Si layer 2402 is then blanket deposited on the workfunction metal 2302 both on the wafer and around the nanowires 1502. Specifically, using a conformal deposition process, such as ALD or CVD, the poly-Si layer 2402 is deposited to a uniform thickness T$_{POLY\text{-}Si}$' on the wafer (i.e., on a side of the workfunction metal 2302 opposite the gate dielectric 2202) and around the nanowires 1502 (i.e., on a side of the workfunction metal 2302 opposite the gate dielectric 2202). According to an exemplary embodiment, poly-Si layer 2202 is deposited to a uniform thickness T$_{POLY\text{-}Si}$' of from about 10 nm to about 30 nm, and ranges therebetween, both on the wafer and around the nanowires 1502.

In the present example, based on the varied suspension heights of the nanowires 1502 the poly-Si layer 2402 is only present underneath the nanowires 1502 in Region III' of the wafer. In Region I' and Region II' of the wafer, the workfunction metal 2402 on the nanowires has already merged with workfunction metal 2402 on the wafer and closed off the gap beneath the nanowires 1502 in those regions.

Figure 25:
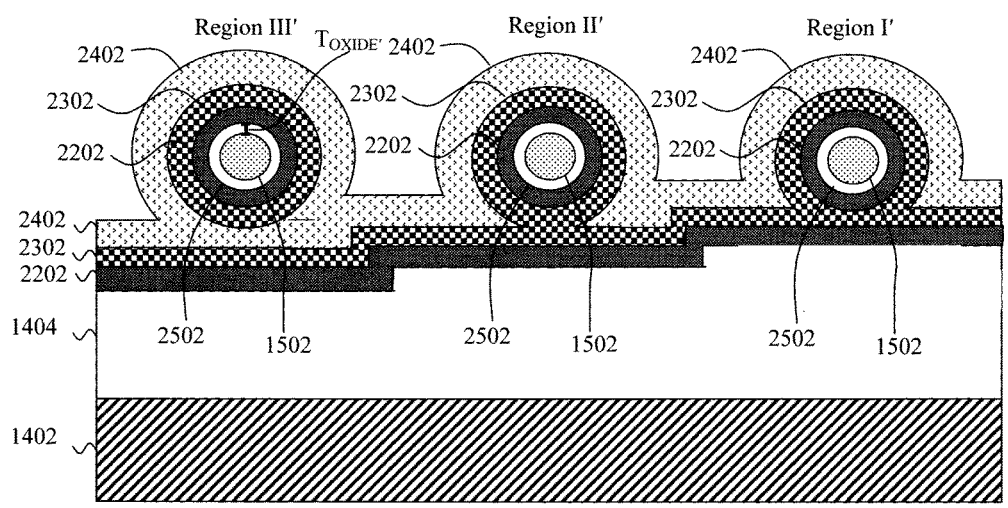
FIG. 25 is a cross-sectional diagram illustrating an anneal in an oxygen ambient having been used to form a conformal oxide layer at the interface between the gate dielectric and the nanowires according to an embodiment of the present invention.

Finally, as shown in FIG. 25, an anneal in an oxygen ambient is then used to form a conformal oxide layer 2502 at the interface between the gate dielectric 2202 and the nanowires 1502. As provided above, oxidation at this interface occurs between the conformal gate dielectric and the nanowires due to the relative oxygen affinity of the gate dielectric (e.g., HfO$_2$) versus the semiconductor material in the nanowires (Si, for example, steals oxygen from HfO$_2$ and makes it slightly sub stoichiometric) and metal catalyzation of the oxide growth. Thus, the conformal oxide layer formed is an oxide of the semiconductor material in the nanowires, e.g., SiO$_2$ for Si wires, germanium dioxide (GeO$_2$) or silicon germanium oxide for germanium (Ge) or silicon germanium (SiGe) nanowires, respectively. According to an exemplary embodiment, the anneal is performed at a temperature of from about 200° C. to about 500° C., and ranges therebetween, for a duration of from about 5 minutes to about 15 minutes, and ranges therebetween.

In the example depicted, the oxide layer 2502 formed around each of the nanowires 1502 has a uniform thickness T$_{OXIDE}$'. This is due to the oxidation being performed simultaneously and under the same conditions for each of the transistors, and further due to the fact that—in all three regions of the wafer—the gate dielectric 2202 around the nanowires 1502 is not in direct physical contact with the underlying oxide layer 1404. Namely, in all three regions there is at least one other gate stack material separating the gate dielectric 2202 around the nanowires 1502 from the gate dielectric 2202 on the wafer.

However, if in any region the gate dielectric 2202 around the nanowires 1502 was in direct physical contact with the underlying oxide layer 1404 (which would be the case if the gate dielectric 2202 around the nanowires 1502 merged with the gate dielectric 2202 on the wafer) then the oxide layer 1404 could serve as an additional source of oxygen that would diffuse through the (e.g., high-κ dielectric) to the interface between the gate dielectric 2202 and the nanowires 1502. This would result in a thicker oxide layer 2502 being formed around the nanowires 1502 in that region. For a description and depiction of a thicker oxide being formed at the nanowire/gate dielectric interface see Ser. No. 14/671,041.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A complementary metal oxide semiconductor (CMOS) device comprising multiple nanowire-based transistors having different threshold voltages, comprising:
   a wafer comprising an oxide layer on a substrate;
   nanowires and pads on the wafer, wherein the pads are attached to opposite ends of the nanowires and anchor the nanowires to the wafer, and wherein the nanowires are suspended at varying heights above the oxide layer; and
   gate stacks of the nanowire-based transistors at least partially surrounding portions of each of the nanowires, the gate stacks comprising i) a conformal gate dielectric both around the nanowires and on the wafer beneath the nanowires; ii) a conformal workfunction metal on the conformal gate dielectric both around the nanowires and on the wafer beneath the nanowires, wherein an amount of the conformal workfunction metal deposited around the nanowires is based on the varying heights at which the nanowires are suspended over the oxide layer; and iii) a conformal poly-silicon layer on the conformal workfunction metal both around the nanowires and on the wafer beneath the nanowires,
   wherein the portions of the nanowires at least partially surrounded by the gate stacks serve as channel regions of the nanowire-based transistors, wherein portions of the nanowires extending out from the gate stacks and the pads serve as source and drain regions of the nanowire-based transistors, and wherein the nanowire-based transistors have different threshold voltages based on the varied amount of the conformal workfunction metal deposited around the nanowires.

2. The CMOS device of claim 1, further comprising:
   a conformal oxide layer at an interface between the conformal gate dielectric and the nanowires.

3. The CMOS device of claim 1, wherein the wafer further comprises a SOI layer on a side of the oxide layer opposite the substrate, and wherein the SOI layer is present beneath the pads.

4. The CMOS device of claim 1, wherein the oxide layer is recessed at varying depths beneath the nanowires.

5. The CMOS device of claim 1, wherein the conformal workfunction metal comprises an n-type workfunction metal selected from the group consisting of lanthanum, titanium, and tantalum.

6. The CMOS device of claim 1, wherein the conformal workfunction metal comprises a p-type workfunction metal selected from the group consisting of aluminum, dysprosium, gadolinium, and ytterbium.

* * * * *